United States Patent [19]

Hess et al.

[11] Patent Number: 4,801,623
[45] Date of Patent: Jan. 31, 1989

[54] PROCESS FOR THE PRODUCTION OF A THIXOTROPIC AGENT, ESPECIALLY FOR STORABLE REACTIVE POLYURETHANE SYSTEMS

[75] Inventors: Heinrich Hess; Gerhard Grögler, both of Leverkusen; Richard Kopp, Cologne, all of Fed. Rep. of Germany

[73] Assignee: Bayer Aktiengesellschaft, Bayerwerk, Fed. Rep. of Germany

[21] Appl. No.: 144,897

[22] Filed: Jan. 14, 1988

[30] Foreign Application Priority Data

Jan. 20, 1987 [DE] Fed. Rep. of Germany ....... 3701409

[51] Int. Cl.$^4$ ............................................. C08G 18/14
[52] U.S. Cl. ...................................... 521/157; 528/49; 528/73
[58] Field of Search ...................... 521/157; 528/49, 73

[56] References Cited

U.S. PATENT DOCUMENTS

| 3,183,109 | 5/1965 | Neumann | 106/252 |
| 4,400,497 | 8/1983 | Blum et al. | 528/45 |
| 4,403,085 | 9/1983 | Christenson et al. | 528/45 |
| 4,483,974 | 11/1984 | Grogler et al. | 528/68 |
| 4,496,684 | 1/1985 | O'Connor et al. | 524/591 |

Primary Examiner—Maurice J. Welsh
Attorney, Agent, or Firm—Gene Harsh; Joseph C. Gil; Thomas W. Roy

[57] ABSTRACT

The present invention is directed to a process for the production of a thixotropic agent by reacting a polyisocyanate containing a uretdione group with a polybasic carboxylic acid containing at least one carboxyl group and, optionally, OH groups. The present invention is also directed to thixotropic high molecular weight polyols containing the above thixotropic agent. Finally, the present invention is directed to storable, reactive polyurethane systems comprising thixotropic polyols and polyisocyanates which are essentially unreactive with the polyols at room temperature.

10 Claims, 2 Drawing Sheets

PROCESS FOR THE PRODUCTION OF A THIXOTROPIC AGENT, ESPECIALLY FOR STORABLE REACTIVE POLYURETHANE SYSTEMS

BACKGROUND OF THE INVENTION

1. Field of the Invention

This invention relates to a process for the production of thixotropic agents, especially for reactive polyurethane systems, by reacting polyisocyanates containing in particular uretdione groups with polybasic carboxylic acids containing at least one carboxyl group and, optionally, OH groups, preferably in the presence of polyether polyols of relatively high molecular weight. These reaction products, preferably in polyether polyols, are particularly suitable for use as thixotropic agents in the production of coating compositions and adhesives from storable reactive polyurethane systems, so-called one-component systems.

2. Description of the Prior Art

It is known that coating compositions and adhesives which are not intended for application to horizontal surfaces have to show certain flow properties to ensure that they do not run during hardening. To this end, various thixotropic aids are added to prevent not only running, but also the sedimentation of fillers, pigments or other solid particles such as finely divided solid reactants. Thus, inorganic thixotropic and thickening agents are known to include finely divided pyrogenic (modified) silica and modified layer silicates (=smectites), while organic thixotropic and thickening agents are known to include castor oil derivatives.

In the production of coating compositions or adhesives based on polyurethanes, which are not intended for application to horizontal surfaces, finely divided polyureas of aliphatic or aromatic polyamines and aliphatic or aromatic polyisocyanates have previously been used as thixotropic agents. These polyureas may be added either to the polyol component or to the polyisocyanate component and bring about effective thickening of the corresponding component, even before application. If this is undesirable for reasons of practical application, the thixotropic effect may also be developed during application, i.e. in the mix head, enroute to the mold or directly on the surface to be coated, by initially adding the polyamine to the polyol component and then rapidly developing the thixotropic effect by addition of the corresponding isocyanate component with formation of polyurea.

Even in the case of the known, thermosetting, storable reactive polyurethane systems, so-called one-component systems (cf. DE-OS No. 32 30 757 or DE-OS No. 31 12 054), which may be hardened inter alia by the application of heat to form polyurethane, it may be necessary to add the thixotropic agent to the reactive mixtures not only to prevent the coating compositions or adhesives applied from running, but also to prevent sedimentation of the suspended solid constituents during storage.

The known thixotropic agents are not satisfactory because their effect when used in the usual quantities is generally too weak. However, if the desired effect is obtained by increasing the quantity added, the fully reacted polyurethane shows inadequacies, such as reductions in strength when inorganic thixotropicizing agents are used or defects through bubble formation or a reduction in adhesive effect when organic thixotropic agents, such as polyureas, are added. Polyureas are attended by the further disadvantage that the desired anti-sedimentation effect is not obtained in the event of long-term storage.

Accordingly, an object of the present invention is to provide a suitable thixotropic and thickening agent for thermosetting, storable reactive polyurethane systems (so-called one-component polyurethane systems), which is not attended by any of the known disadvantages.

SUMMARY OF THE INVENTION

The present invention is directed to a process for the production of a thixotropic agent by reacting a polyisocyanate containing uretdione group with a polybasic carboxylic acid containing at least one carboxyl group and, optionally, OH groups. The present invention is also directed to thixotropic high molecular weight polyols containing the above thixotropic agent. Finally, the present invention is directed to storable, reactive polyurethane systems comprising thixotropic polyols and polyisocyanates which are essentially unreactive with the polyols at room temperature.

DETAILED DESCRIPTION OF THE INVENTION

Figure 1:
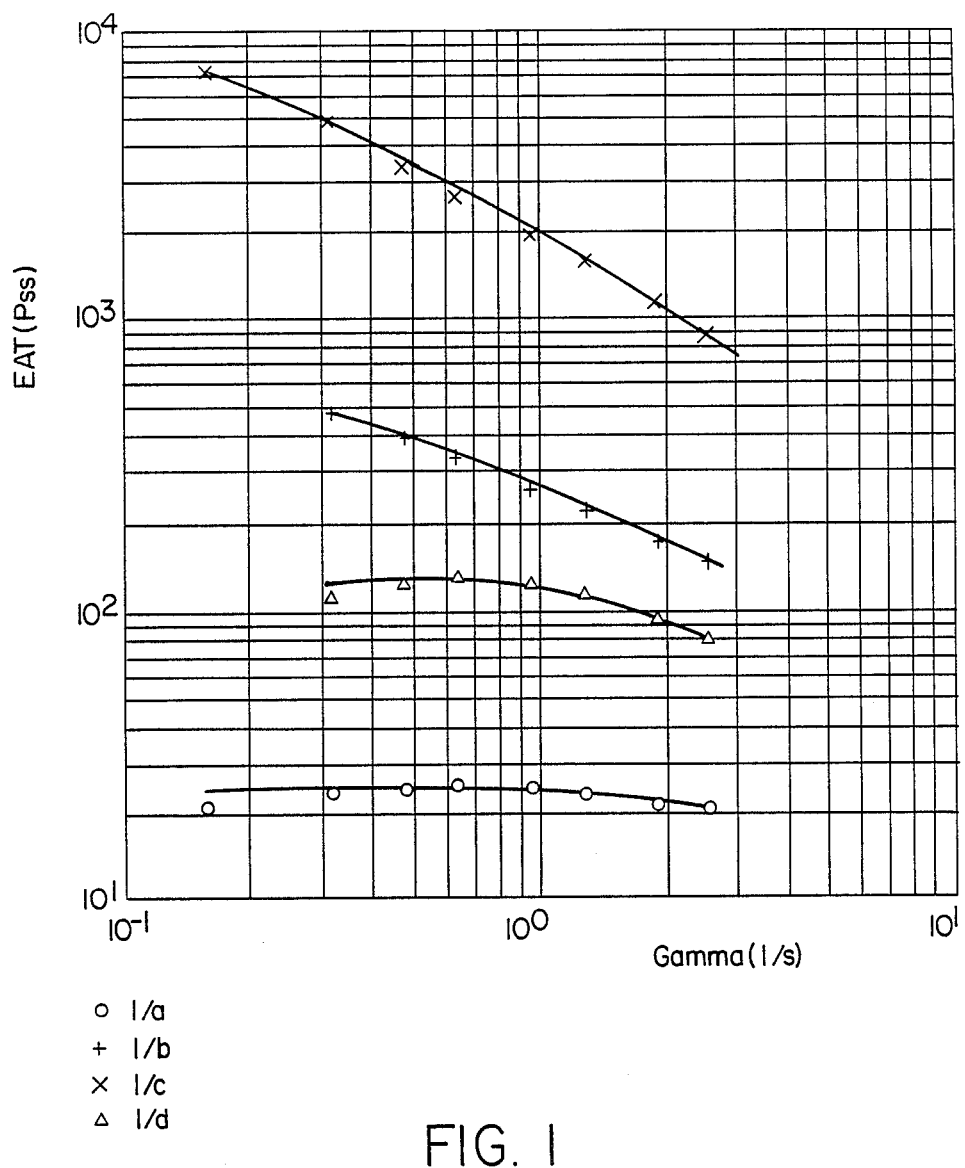

According to the invention, the thixotropic agents may be prepared by reacting polyisocyanates, preferably diisocyanates, containing uretdione groups with polybasic carboxylic acids containing at least one and preferably 2 to 4 carboxyl groups and, optionally, OH groups, preferably 0 to 6 OH groups. This reaction is conducted in a reactive reaction medium such as a relatively high molecular weight polyol having a molecular weight of 400 to 10,000, preferably a polyether polyol containing secondary OH groups. The polybasic carboxylic acids used are preferably aliphatic $C_2$–$C_{20}$, more preferably $C_2$–$C_{10}$, carboxylic acids. The following carboxylic acids or hydroxycarboxylic acids are particularly suitable for use in the process according to the invention: lactic acid, ricinoleic acid, malic acid, tartaric acid, citric acid, dimethylolpropionic acid and adipic acid. Malic acid, tartaric acid, citric acid, dimethylolpropionic acid and adipic acid are particularly preferred.

The polyisocyanates containing uretdione groups are known from the prior art, especially from DE-OS No. 32 30 757 (EP-A No. 103,323) and DE-OS No. 31 12 054. Dimeric hexamethylene diisocyanate, dimeric isophorone diisocyanate, dimeric diphenylmethane diisocyanate or dimeric toluylene diisocyanate are preferably used. Dimeric toluylene diisocyanate is particularly preferred for the process according to the invention.

To carry out the process according to the invention, the (hydroxy) carboxylic acids are dissolved in a relatively high molecular weight polyol and the polyisocyanates containing uretdione rings are added in liquid, preferably dissolved, form or are suspended in finely divided solid form. The thixotropic agent, preferably a thixotropic polyether polyol, is prepared at a sufficient reaction velocity by heating to a temperature of about 90° to 150° C., preferably a temperature of about 100° to 120° C., optionally in the presence of catalysts known from PUR chemistry.

To prepare the thixotropic agent, the polybasic carboxylic acid and the uretdione polyisocyanate are preferably used in an equivalent ratio of (COOH+OH):-NCO of about 1 to 100, preferably about 1 to 20.

The present invention also relates to a process for preparing thixotropic, relatively high molecular weight polyols which are liquid at room temperature, especially polyether polyols containing secondary OH groups and having molecular weights of 400 to about 10,000, characterized in that polyisocyanates containing uretdione groups are reacted with polybasic carboxylic acids containing at least one carboxyl group and, optionally, OH groups.

To this end, about 0.01 to 10% by weight, preferably about 0.1 to 5% by weight of the polybasic carboxylic acid and at least equivalent quantities, based on carboxylic acid, of uretdione polyisocyanates are added to the relatively high molecular weight polyols. To accelerate the reaction the known catalysts of polyurethane chemistry, such as tertiary amines and organometallic compounds, preferably triethylamine, tributylamine, diazabicyclo-2,2-octane and organometallic tin or lead compounds, are added to the reactive mixture.

The reactive reaction medium used for the production of the thixotropic agents according to the invention, which may be thickened during the process, may be any of the relatively high molecular weight polyols known in polyurethane chemistry, preferably polyols containing 2 to 8 hydroxyl groups, more preferably 2 to 4 hydroxyl groups and having molecular weights of 400 to about 10,000. Hydroxyl-group-containing polyesters, polyethers, polythioethers, polyacetals, polycarbonates and polyesteramides are suitable. Preferred are polyethers containing at least 2, preferably 2 to 8, more preferably 2 to 4 and most preferably 2 to 3 hydroxyl groups. The polyethers may be prepared by the polymerization of epoxides (such as ethylene oxide, propylene oxide, butylene oxide, tetrahydrofuran, styrene oxide or epichlorohydrin) on their own, for example in the presence of Lewis catalysts, or by addition of these epoxides (preferably ethylene oxide and propylene oxide), optionally in admixture or successively, to starter compounds containing reactive hydrogen atoms such as water, alcohol, ammonia or amines. Examples include ethylene glycol, 1,3- or 1,2-propylene glycol, trimethylolpropane, glycerol, sorbitol, 4,4'-dihydroxydiphenylpropane, aniline, ethanolamine or ethylenediamine. It is also possible to use sucrose polyethers, of the type described for example in DE-AS Nos. 11 76 358 and 10 64 938, and formitol or formose-started polyethers (DE-OS Nos. 26 39 083 and 27 37 951). Polyethers predominantly containing (up to about 90% by weight) secondary OH groups are particularly preferred.

The thixotropic agents obtained in accordance with the invention, preferably thixotropic polyols, retain their thixotropic property even during storage and may thus be used for preparing thixotropic storable, reactive polyurethane mixtures, more especially polyurethane coating compositions and/or adhesives.

Accordingly, the present invention also relates to thixotropic reactive polyurethane systems containing polyols, uretdione polyisocyanates of retarded reactivity and optionally known chain-extending agents, auxiliaries and additives, characterized in that at least about 50% of the polyol component is based on the thixotropic polyols according to the present invention.

Thermosetting reactive systems stable in storage at room temperature for the production of polyurethanes are known and based on solid polyisocyanates of retarded reactivity suspended in relatively high molecular weight, isocyanate-reactive compounds, preferably polyols and/or polyamines (cf. DE-OS No. 31 12 054, DE-OS No. 32 30 757). According to DE-OS No. 3,112,054 (U.S. Pat. No. 4,400,497, herein incorporated by reference in its entirety) and DE-OS No. 3,230,757 (U.S. Pat. No. 4,483,974, herein incorporated by reference in its entirety), stabilized, solid polyisocyanates of retarded reactivity are prepared by reaction with, for example, polyamines, hydrazine(s) or hydrazide compounds containing terminal —CO.NH.NH$_2$ groups. Stabilization by coating with polyadducts gives polyisocyanate particles which only react as free polyisocyanates above a certain temperature, the so-called thickening temperature, in the one-component reactive polyurethane systems.

Below that temperature, the polyisocyanate particles are externally inert. In the form of suspensions in relatively high molecular weight polyols and/or polyamines, optionally with addition of low molecular weight polyols or (aromatic) polyamines, they are reactive systems which are stable in storage below the so-called "thickening temperature." Above the thickening temperature, the polyaddition reaction begins to take place.

The reaction components are preferably present in these so-called one-component polyurethane systems in the correct quantitative ration for the production of the final polyurethane plastics. The hardened polyurethanes are prepared simply by heating the one-component system to temperatures of about 70° to 180° C., preferably about 100° to 130° C.

Preferred compositions are those in which isocyanates and amines or polyols are present in such quantities that an index of about 50 to 200, preferably about 90 to 135 is maintained.

Suitable solid polyisocyanates are those which have a melting point above about 40° C. and preferably above about 80° C., such as 1,5-naphthalene diisocyanate, dimeric 4,4'-diisocyanatodiphenylmethane, dimeric 2,4-diisocyanatotoluene, 3,3'-diisocyanato-4,4'-dimethyl-N,N'-diphenylurea and N,N'-bis-[4-(4- or 2-isocyanatophenylmethyl)-phenyl]-urea. Dimeric 2,4-diisocyanatotoluene and 3,3'-diisocyanato-4,4'-dimethyl-N,N'-diphenylurea are particularly preferred.

The polyisocyanates are "deactivated" (stabilized) by the action of preferably aliphatic polyamines having molecular weights of 32 to 399 and optionally by the action of aliphatic polyamines having molecular weights of 400 to about 8000. Suitable deactivating agents are listed in DE-OS No. 3,230,757 and in DE-OS No. 3,112,054.

Other suitable deactivators for the isocyanate component are open-chain, monocyclic or bicyclic amidines or guanidines which do not contain any isocyanate-reactive hydrogen atoms. Examples of compounds such as these are tetramethyl guanidine, pentamethyl guanidine, 1,2-dimethyl tetrahydropyrimidine, 1,8-diazabicyclo-[5,4,0]-undec-7-ene, 1,5-diazabicyclo-[4,3,0]-non-5-ene. Further examples of amidines such as these can be found in DE-OS No. 3,403,500.

The solid polyisocyanates may be deactivated in situ during the preparation of the one-component system. However, polyisocyanates which have already been deactivated in known manner may also be used.

Liquid or low-melting (<50° C.), low molecular weight and/or relatively high molecular weight polyols for example may be used as the NCO-reactive suspension medium for the solid, stabilized polyisocyanates.

The polyols previously mentioned may be used as the polyols having a molecular weight of 62 to about 10,000. It is preferred to use the polyesters, polyethers, polythioethers, polyacetals, polycarbonates and polyesteramides containing at least 2 and preferably 2 to 4 hydroxyl groups and having a molecular weight of 400 to about 8000, including those known for the production of homogeneous and cellular polyurethanes. Detailed examples of polyols such as these can be found, for example, in DE-OS No. 2,920,501, DE-OS No. 2,854,384 and DE-OS No. 3,230,757.

Polyhydroxyl compounds containing urethane or urea groups and optionally modified, natural polyols such as castor oil, carbohydrates or starch may also be used. Adducts of alkylene oxides with phenol-formaldehyde resins or with urea-formaldehyde resins may also be used in the process according to the invention.

According to the invention, polybutadienes containing terminal hydroxyl groups are also suitable because they give particularly elastic and hydrolysis-stable products. Polyhydroxyl compounds containing high molecular weight polyadducts or polycondensates or polymers in finely dispersed or even dissolved form may also be used.

Polyadduct-containing polyhydroxyl compounds are obtained by carrying out polyaddition reactions (for example reactions between polyisocyanates and amino-functional compounds) or polycondensation reactions (for example between formaldehyde and phenols and/or amines) in situ in the above-mentioned compounds containing hydroxyl groups.

Polyhydroxyl compounds modified by vinyl polymers, of the type obtained for example by polymerization of styrene and acrylonitrile in the presence of polyethers or polycarbonate polyols, are also suitable for the process according to the invention.

Representatives of these compounds suitable for use in accordance with the invention are described, for example, in High Polymers, Vol. XVI, "Polyurethanes, Chemistry and Technology", edited by Saunders-Frisch, Interscience Publishers, New York, London, Vol. I, 1962, pages 32–42 and pages 44 and 54 and Vol. II, 1964, pages 5–6 and 198–199, and in Kunststoff-Handbuch, Vol. VII, Vieweg-Höchtlen, Carl-Hanser-Verlag, München, 1966, for example on pages 45–71 and in DE-OS Nos. 2,854,384 and 2,929,501.

Other suitable polyols are polymers containing hydroxyl groups, for example copolymers of olefinically unsaturated monomers and olefinically unsaturated monomers containing active hydrogen. They are described, for example, in EP-A No. 62 780, page 5 and the examples. They are preferably used for sealing compounds, fillers, adhesives or undersealing compounds.

Mixtures of the above-mentioned compounds containing at least two isocyanate-reactive hydrogen atoms, for example mixtures of polyethers and polyesters, may of course be used.

Low molecular weight chain extending agents or crosslinking agents may also be present in the suspensions. These chain extending agents or crosslinking agents are in particular at least difunctional compounds containing hydroxyl groups attached to aliphatic and/or cycloaliphatic groups and having molecular weights of 62 to 399. Preferred compounds of this type are low molecular weight diols containing hydroxyl groups attached to aliphatic or cycloaliphatic groups and having a molecular weight of from 108 to 399.

These compounds generally contain 2 to 8, preferably from 2 to 4 and more preferably 2 hydroxyl groups. Mixtures of different compounds may of course also be used. Examples of compounds such as these include ethylene glycol, diethylene glycol, triethylene glycol, tetraethylene glycol, trimethylene glycol, 2,3- and/or 1,4-butanediol, 1,5-pentanediol, 1,6-hexanediol, neopentyl glycol, 1,4-bis-hydroxyethylcyclohexane, 1,4-dihydroxycyclohexane, terephthalic acid-bis-($\beta$-hydroxyethyl)-ester, 1,4,3,6-dianhydrohexitols, 1,4-monoanhydrotetritols, propylene glycol, dipropylene glycol, tripropylene glycol, tetrapropylene glycol, bis-2hydroxyethylhydroquinone, bis-(2-hydroxyethyl)resorcinol. Suitable polyfunctional compounds are trimethylolpropane, trimethylolethane, 1,2,6-hexanetriol, glycerol, pentaerythritol, quinitol, mannitol, sorbitol, castor oil and also formose or formitol.

Diols or polyols containing tertiary amines, for example N-methyl diethanolamine, triethanolamine or N,N'-bis-hydroxyethyl piperazine, are also suitable.

It is also possible to use diols containing additional groups, for example adipic acid-bis-(2-hydroxyethyl)-ester, terephthalic acid-bis-(2-hydroxyethyl)-ester, diolurethanes, diolureas or polyols containing sulfonate and/or phosphonate groups, for example 1,6-hexamethylene-bis-(2-hydroxyethylurethane), 4,4'-diphenylmethane-bis-(2-hydroxyethylurea) or the adduct of Na bisulfite with 1,4-butanediol or the alkoxylation products thereof. Other low molecular weight compounds are described in detail in DE-A No. 2,854,384.

The polyols mentioned above may optionally be modified by preliminary reaction with a sub-equivalent quantity of polyisocyanate. Polyisocyanates suitable for this purpose are aliphatic, cycloaliphatic, araliphatic, aromatic and/or heterocyclic polyisocyanates of the type described, for example, in DE-OS No. 2,920,501 (pages 12–16).

In general, it is particularly preferred to use the commercially readily obtainable polyisocyanates such as for example 2,4- and 2,6-toluylene diisocyanate and mixtures of these isomers ("TDI"), polyphenyl-polymethylene polyisocyanates of the type obtained by the phosgenation of aniline-formaldehyde condensates ("crude MDI"), 4,4'- and/or 2,4'-diphenylmethane diisocyanate, 1,6-hexamethylene diisocyanate, 1-isocyanato-3,3,5-trimethyl-5-isocyanato-methyl cyclohexane, perhydro-2,4'- and/or -4,4'-diphenylmethane diisocyanate. It is of course possible to use mixtures of the abovementioned polyhydroxyl compounds and polyamino compounds.

In addition, liquid or low-melting (<50° C.), low molecular weight and/or relatively high molecular weight aromatic and/or aliphatic polyamines may also be used as the NCO-reactive suspension medium for the solid, stabilized polyisocyanates. Relatively high molecular weight polyamines are preferred. Low molecular weight polyamines may be present therein as stabilizers, optionally in small quantities.

Suitable relatively high molecular weight polyamine compounds containing aromatic amino groups and having a molecular weight of 400 to about 6000 include polyamine compounds of the type which can be obtained by the (preferably basic) hydrolysis of corresponding NCO prepolymers based on relatively high molecular weight polyhydroxyl compounds and excess aromatic diisocyanates. Examples of this process can be found in DE-OS No. 2,948,419; DE-OS No. 3,039,600; DE-OS No. 3,112,118; EP-A No. 61,627; EP-A No.

71,132 and EP-A No. 71,139. The first of these patent specifications also describes other state-of-the-art processes for the production of aromatic compounds of relatively high molecular weight structure. The processes according to DE-OS No. 2,948,419 and the other patent specifications cited are preferably used for the production of polyether polyamines and also polyester, polyacetal, polythioether or polycaprolactone polyamines, preferably 2- or 3- functional polyamines which contain urethane groups (from the reaction of the corresponding relatively high molecular weight polyhydroxyl compounds with the excess polyisocyanates) and which carry amino groups as the residue of the (former) polyisocyanate. However, the aromatic, relatively high molecular weight polyamines may also be produced by other methods, for example by reaction of NCO prepolymers with excess quantities of hydrazine, aminophenylethylamine or other diamines in accordance with DE-AS No. 1,694,152. Another method is described in FR-PS No. 1,415,317 and comprises converting the NCO prepolymers with formic acid into the N-formyl derivatives, followed by saponification. The reaction of NCO prepolymers with sulfamic acid in accordance with DE-AS No. 1,155,907 also leads to polyamines of relatively high molecular weight. In addition to relatively high molecular weight polyamine compounds containing amino groups attached to aromatic radicals (via aromatic polyisocyanates), it is also possible to produce the previously mentioned relatively high molecular weight polyamine compounds containing amino groups attached to aliphatic radicals (via aliphatic polyisocyanates). These relatively high molecular weight aliphatic polyamines may be used both as stabilizers for the polyisocyanate component and also as a further component serving as suspension medium.

Low molecular weight aromatic diamines having molecular weights of 108 to 399 may be used as chain-extending agents. Aromatic polyamines are also understood to include amines of the type which contain the amino group attached to heterocyclic radicals of aromatic character. Suitable aromatic polyamines include p-phenylenediamine, 2,4- and/or 2,6-toluylenediamines, diphenylmethane-4,4'-, -2,4'- and/or -2,2'-diamines, 3,3'-dichloro-4,4'-diaminodiphenyl-methane, 3-($C_1$–$C_8$)-alkyl-4,4'-diaminodiphenylmethanes, 3,3'-di-($C_1$–$C_4$)-4,4'-diaminodiphenylmethanes and 3,3',5,5'-tetra-($C_1$–$C_4$)-alkyl-4,4'-diphenylmethanes, 4,4'-diaminodiphenyl sulfides, sulfoxides or sulfones, diamines containing ether groups according to DE-A Nos. 1,770,525 and 1,809,172 (U.S. Pat. Nos. 3,654,364 and 3,736,295), 2-halogen-1,3-phenylenediamines optionally substituted in the 5-position (DE-A Nos. 2,001,772; 2,025,896; and 2,065,869), bisanthranilic acid esters (DE-A Nos. 2,040,644 and 2,160,590), 2,4-diaminobenzoic acid esters according to DE-A No. 2,025,900 and toluylenediamines substituted by one or two ($C_1$–$C_4$) alkyl groups. Particular preference is attributed to 3,5-diethyl-2,4- and/or -2,6-diaminotoluene (particularly technical (80/20) or (65/35) isomer mixtures thereof), asymmetrically tetraalkyl-substituted diaminodiphenylmethanes, for example 3,5-diethyl-3',5'-diisopropyl-4,4'-diaminodiphenylmethane and isomer mixtres thereof according to DE-A No. 2,902,090, 4,4'-diaminobenzanilide and 3,5-diaminobenzoic acid ($C_1$–$C_4$) alkyl ester, 4,4'- and/or 2,4'-diaminodiphenylmethane and also naphthylene-1,5-diamine.

The known polyurethane catalysts may optionally be used. Among such catalysts, tertiary amines or metal catalysts may be used to particularly good effect.

Auxiliaries and additives which may optionally be present include dyes or pigments, fillers such as silica gel, gypsum, talcum, active carbon, metal powder, UV absorbers or stabilizers and phenolic antioxidants, light stabilizers, blowing agents, surface-active additives, such as emulsifiers or foam stabilizers, optionally cell regulators, antiblocking agents, silicones, flameproofing agents or fungistatic and/or bacteriostatic substances.

Suitable fillers include fibers, i.e. any fibrous reinforcing materials such as glass fibers, graphite fibers and asbestos fibers or fibrous materials emanating from an organic polymer, for example, from a polyester such as polyethylene terephthalate, or preferably aromatic polyamides, such as m-phenylene/isophthalic acid polyamide or poly-p-phenylene terephthalamide or polycaprolactam. These fibrous materials may be present in the form of mats, tows, continuous fibers, nonwovens, woven cloths or even random staple-fiber blends. It is preferred to use glass fibers finished with sizes to give the fibers an affinity for polyurethanes. The quantity of filler to be incorporated depends upon the desired improvement in the mechanical properties and generally amounts to between about 5 and 60% by weight.

If cellular polyurethanes are to be produced by the process according to the invention, water and/or readily volatile organic compounds are used as blowing agents. Suitable organic blowing agents include acetone, ethyl acetate, methanol, ethanol halogen-substituted alkanes (such as methylene chloride, chloroform, ethylidene chloride, vinylidene chloride, monofluorotrichloromethane, chlorodifluoromethane and diethylether.

Other examples of blowing agents and information on the use of blowing agents can be found in Kunststoff-Handbuch, Vol. VII, edited by Vieweg and Höchtlen, Carl-Hanser-Verlag, Munich 1966, for example, on pages 108 and 109, 453 and 455 and 507–510.

It is also possible to use surface-active additives (emulsifiers and foam stabilizers). Suitable emulsifiers include the sodium salts of castor oil sulfonates or fatty acids or salts of fatty acids with amines such as diethylamine oleate or diethanolamine stearate. Alkali or ammonium salts of sulfonic acids (such as dodecylbenzenesulfonic acid or dinaphthylmethane disulfonic acid) or fatty acids (such as ricinoleic acid or of polymeric fatty acids) may also be used as surface-active additives.

Suitable foam stabilizers include water-soluble polyether siloxanes. The structure of these compounds is generally such that a copolymer of ethylene oxide and propylene oxide is attached to a polydimethyl siloxane residue. Foam stabilizers such as these are described, for example, in U.S. Pat. No. 2,764,565.

It is also possible to use reaction retarders, for example acid-reacting substances, such as hydrochloric acid, organic acid halides or organic acids; cell regulators such as paraffins or fatty alcohols or dimethyl polysiloxanes; and pigments or dyes and flame-proofing agents such as tris-chloroethyl phosphate or ammonium phosphate and polyphosphate: stabilizers against the effects of aging and weather: plasticizers; fungistatic and bacteriostatic substances; and fillers suoh as barium sulfate, kieselguhr, carbon black or whiting.

Further examples of surface-active additives and foam stabilizers which may optionally be used in accordance with the invention and also cell regulators, reaction retarders, stabilizers, flameproofing agents, plasticizers, dyes and fillers, fungistatic and bacteriostatic substances and information on how such additives are used and how they work can be found in Kunststoff-Handbuch, Vol. VI, edited by Vieweg and Höchtlen, Carl-Hanser-Verlag, Munich 1966, for example on pages 103–113 and in DE-OS Nos. 2,854,384 and 2,920,501.

The reactive PU mixtures obtained can be applied by casting, knife coating or spread coating at room temperature, depending on the addition of the thixotropic agents to the starting components. These reactive mixtures are suspensions of a solid polyisocyanate stabilized by a polyadduct coating in a polyol and, optionally, polyamine component. These mixtures are hardened by the effect of heat. The processing of the thixotropic systems in accordance with the invention is determined by their character. Thixotropic systems in accordance with the invention may be applied by hand or by a suitable extrusion or pumping unit (for example through a cartridge or a coating knife) to any desired substrates, for example textile substrates, such as nonwovens, knits and wovens, leather (skiver), matrices (for example suede leather-silicone matrices) or intermediate supports (for example release papers) to form coatings or finishes or to a variety of technical articles of metal, glass, ceramics or plastics and optionally hardened at elevated temperature by further handling or technical processing steps. Liquid systems pourable at room temperature may be processed by casting.

The mixtures may also be processed by centrifugal molding. Hollow bodies may be produced by introducing the reactive mixture into molds and distributing them over the surface of the molds by corresponding rotational movements. When blowing agents are used, it is possible to produce cellular polyurethanes optionally having an integral density structure. Surface coatings, impression molds or moldings may also be produced by dip coating techniques.

The invention is further illustrated, but is not intended to be limited by the following examples in which all parts and percentages are by weight unless otherwise specified.

EXAMPLES

EXAMPLE 1

Production of four polyethers thixotropicized to different extents to illustrate the thixotropicizing effect of the polyadducts according to the invention The quantities indicated in Table 1 of four different (hydroxy) carboxylic acids were dissolved at elevated temperature (around 100° C.) in 100 parts by weight of a polyoxyalkylene etherdiol of 80% by weight propylene oxide and 20% by weight ethylene oxide having a molecular weight of 4000. After cooling to room temperature, the indicated quantities of dimeric toluylene diisocyanate (Desmodur TT, a product of Bayer AG) were suspended, 0.1 part Pb octoate (Octa-Soligen Pb 24, a product of Borchers) was added and the mixture was heated with stirring for 30 minutes to 100° C. The mixture was then degassed by application of a vacuum and, at the same time, allowed to cool to room temperature. Thickened, in some cases thixotropic polyethers were obtained.

The flow curves, i.e. the dependence of the shear stress $\tau$ on the shear rate $\gamma$, were continuously recorded at room temperature using an Instron rotational rheometer. A cone-and-plate measuring arrangement 40 mm in diameter for a cone angle of 105 mrad was used. The use of the cone-and-plate measuring arrangement ensured that, at the particular shear rate adjusted, the same shear rate prevailed over the entire cross-section of the sample to be measured. The shear rate was linearly increased to the maximum value of $2.1 \, s^{-1}$ in 25 seconds and the shear stress recorded. The apparent viscosity $n_a$ was calculated from the shear stress $\tau$ and shear rate $\gamma$ values in accordance with the equation $n_a = \tau/\gamma$.

Figure 2:
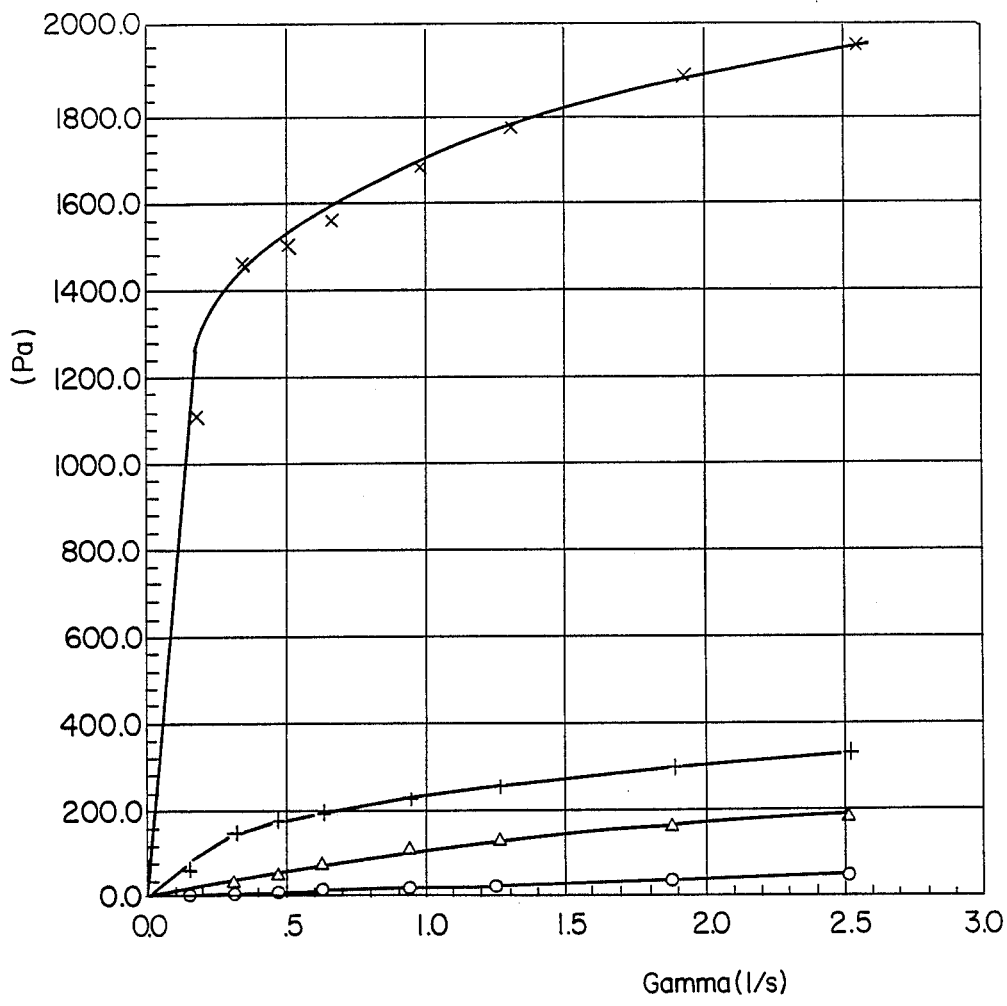

The particular degree of thixotropy can be seen from the curves in FIG. 1, while the particular degree of structural viscosity of the thickened polyethers can be seen from the curves in FIG. 2.

TABLE 1

| EXAMPLE | 1/a | 1/b | 1/c | 1/d |
|---|---|---|---|---|
| Parts by weight polyoxyalkylene etherdiol, MW 4000 | 100 | 100 | 100 | 100 |
| Parts by weight (hydroxy) carboxylic acid | 1.0 2,2-bis-(hydroxy methyl)-propionic acid (DMPA) | 0.2 adipic acid | 0.1 2-hydroxy-butanediacid (malic acid) | 0.5 adipic acid |
| Parts by weight dimeric toluylene diisocyanate | 3.0 | 3.0 | 3.0 | 3.0 |
| Pb octoate | 0.02 | 0.02 | 0.02 | 0.02 |
| Viscosity as measured with a laboratory Visko-Tester [Pas] | 60 | 50 | 40 | 1000 |
| Thixotropic and structural viscosity by appearance | very low | slight | distinct | strong |

EXAMPLE 2

(a) A solution prepared at 100° C. of 0.1 parts by weight malic acid in 3 parts by weight ethylene glycol was added to a mixture of 67 parts by weight of a polyoxypropylene etherdiol (molecular weight 1000) and 45 parts by weight of a polyoxypropylene ethertriol (molecular weight 450). The mixture was heated to 70° C. 15 parts by weight dimeric 2,4-toluylene diisocyanate (Desmodur TT, a product of Bayer AG) and 0.2 parts by weight of Pb octoate (Octa-Soligen Pb 24, a product of Borchers) were then successively added and the mixture was heated for 1 hour in a water jet vacuum to 120° C. A highly viscous, thixotropic polyol mixture was obtained.

(b) 0.7 parts by weight of a 10% by weight solution of diazabicyclo-2,2,2-octane (DABCO) in a polyoxypropylene ethertriol (molecular weight 450) and 1.3 parts by weight of a polyoxypropylene ethertriamine (molecular weight 438, Jeffamine T-403, a product of Texaco) were successively mixed with rapid stirring into the polyol mixture obtained in accordance with (a). 71 parts by weight of Desmodur TT polyisocyanate are incorporated in the mixture, which contained an aliphatic amine, using a high speed stirrer, after which the mixture was degassed for 30 minutes at 40° C. in a water jet vacuum. The isocyanate component was thus deactivated.

(c) After application even to vertical surfaces, the final one-component reactive polyurethane adhesive did not run and had a viscosity of 300 mPas and a thickening temperature of 90° C.

The adhesive test was carried out with 20×40×4 mm test specimens of polyester resin reinforced with 30% by weight of glass fibers. After application of the adhesive in the form of a narrow bead to the end of a test specimen, a second test specimen was applied to the adhesive-coated side of the first test specimen in such a way that an overlapped surface of 10×20 mm was obtained. The test specimens were held together with a letter clamp. After excess adhesive had emerged laterally from the joint, it was stripped off. An adhesive film thickness in the joint of approximately 0.2 mm was obtained. After curing for 15 minutes at 120° C., the SMC test specimens were joined firmly together. Testing at room temperature revealed a shear strength of 9 N/mm$^2$. The bond line failed with delamination (cohesion failure) of the glass-fiber-reinforced SMC test specimen. Adhesion failure (detachment of the hardened structural adhesive without destruction of the SMC) did not occur.

(d) An adhesive mixture prepared in the same way as described in (c), but without malic acid, had no structural viscosity. It was fluid and had a viscosity of 100,000 mPas at room temperature, so that it presented difficulties when applied to vertical surfaces.

EXAMPLE 3

(a) 4.35 parts by weight of 2,4-toluylene diisocyanate and then 0.02 parts by weight of a 24% by weight Pb octoate solution were added with stirring at room temperature to 100 parts by weight of a polyoxypropylene etherdiol (molecular weight 2000). The mixture was then heated to 100° C. and stirred at that temperature for 1.5 hours under a vacuum of 10 to 20 mbar. The NCO-free (<0.05% by weight NCO) OH prepolymer had a viscosity at room temperature of 4000 mPas, a theoretical molecular weight of 4174 and an OH number of 26.53.

(b) 0.06 parts by weight of 2,2-bis-(hydroxymethyl)-propionic acid (DMPA) were suspended in 5 parts by weight of the OH prepolymer prepared in accordance with a) and dissolved by heating to 100° C. The solution was then degassed for 30 minutes in a water jet vacuum at 100° C. 0.5 parts by weight of Desmodur TT polyisocyanate was then stirred in, followed by heating with stirring for another 30 minutes in vacuo to 100° C. A polyol-polyamine mixture of pasty consistency was obtained. Another 85 parts by weight of the OH prepolymer prepared in accordance with Example 3(a), 2.5 parts by weight of 2,4- and/or 2,6- (ratio 65/35) diamino-3,5-diethyl toluene and 0.25 parts by weight of 3,3'-dimethyl-4,4'-diaminodicyclohexylmethane were then successively added. The mixture was heated with degassing to 100° C. and then cooled to a temperature of 30° to 40° C.

(c) 15.9 parts by weight of Desmodur TT polyisocyanate were then incorporated using a high-speed stirrer. Mixing may also be carried out in any other suitable mixing unit such as a butterfly or planetary mixer or a Petzholdt mixer.

The diisocyanate was deactivated by spontaneous reaction with the diamine previously added on the surface of the isocyanate particles with formation of a protective polyurea shell. After the addition of 1.0 parts by weight of Pb octoate and 1.0 parts by weight of ethylhexanoic acid, the mixture was degassed for 30 minutes at 40° C. A slightly pasty, thermosetting one-component reactive PU system which was stable in storage at room temperature and up to 50° C. was obtained.

On heating to temperatures of 100° to 120° C., this system hardened rapidly to form an elastomer having a Shore A hardness of 65. At room temperature, it hardened in about 7 days to a Shore A hardness of 74. After application to a vertical surface and during heating, the reactive mixture did not run and was therefore eminently suitable for use as a coating composition and sealing compound.

(d) A one-component reactive PU system prepared in accordance with (a)–(c), but without a preliminary reaction of DMPA with the polyisocyanate had no structural viscosity, was completely liquid and had a viscosity at room temperature of 7000 mPas. The mechanical properties of the hardened reactive PU system was identical with those of (c). However, the mixture ran after application to a solid substrate.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A process for the production of a thixotropic polyol agent which comprises adding a polyisocyanate containing a uretdione group to a polybasic carboxylic acid containing at least one carboxyl group and, optionally, OH groups which is dissolved in a relatively high molecular weight polyol and reacting said polyisocyanate with said polybasic carboxylic acid.

2. The process of claim 2 wherein said relatively high molecular weight polyol is a polyether polyol containing secondary hydroxyl groups.

3. The process of claim 1 wherein said polycarboxylic acid is an aliphatic $C_2$–$C_{20}$ carboxylic acid.

4. The process of claim 2 wherein said polycarboxylic acid is an aliphatic $C_2$–$C_{20}$ carboxylic acid.

5. The process of claim 1 wherein said polybasic carboxylic acid comprises a member selected from the group consisting of lactic acid, ricinoleic acid, malic acid, tartaric acid, citric acid, dimethylolpropionic acid and adipic acid.

6. The process of claim 2 wherein said polybasic carboxylic acid comprises a member selected from the group consisting of lactic acid, ricinoleic acid, malic acid, tartaric acid, citric acid, dimethylolpropionic acid and adipic acid.

7. The thixotropic polyol prepared in accordance with claim 1.

8. The thixotropic polyol prepared in accordance with claim 2.

9. A thixotropic, storage-stable, reactive polyurethane system comprising the polyol of claim 7 and a polyisocyanate which is essentially unreactive with said polyol at room temperature.

10. A thixotropic, storage-stable, reactive polyurethane system comprising the polyol of claim 8 and the polyisocyanate which is essentially unreactive with said polyol at room temperature.

* * * * *